(12) United States Patent
Kang et al.

(10) Patent No.: US 12,198,932 B2
(45) Date of Patent: Jan. 14, 2025

(54) METHOD OF MANUFACTURING SEMICONDUCTOR STRUCTURE INCLUDING SPACER FILLER ETCH AND STACKED MANDREL LAYERS AND SEMICONDUCTOR STRUCTURE

(71) Applicant: CHANGXIN MEMORY TECHNOLOGIES, INC., Hefei (CN)

(72) Inventors: Jungsu Kang, Hefei (CN); Sen Li, Hefei (CN); Qiang Wan, Hefei (CN); Tao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 459 days.

(21) Appl. No.: 17/457,970

(22) Filed: Dec. 7, 2021

(65) Prior Publication Data

US 2022/0285162 A1    Sep. 8, 2022

Related U.S. Application Data

(63) Continuation of application No. PCT/CN2021/112162, filed on Aug. 12, 2021.

(30) Foreign Application Priority Data

Mar. 2, 2021    (CN) .......................... 202110229753.X

(51) Int. Cl.
*H01L 21/033*    (2006.01)
*H01L 21/027*    (2006.01)
*H01L 21/308*    (2006.01)

(52) U.S. Cl.
CPC ........ *H01L 21/0337* (2013.01); *H01L 21/027* (2013.01); *H01L 21/0332* (2013.01);
(Continued)

(58) Field of Classification Search
CPC . H01L 21/308; H01L 21/027; H01L 21/0337; H01L 21/033; H01L 21/31144;
(Continued)

(56) References Cited

U.S. PATENT DOCUMENTS 8,623,770 B1    1/2014  Gao et al.
2008/0076071 A1  3/2008  Lim et al.
(Continued)

FOREIGN PATENT DOCUMENTS

CN    103578930 A    2/2014
CN    103715068 A    4/2014
(Continued)

OTHER PUBLICATIONS

First Office Action cited in CN202110229753.X, mailed Mar. 22, 2022, 24 pages.
(Continued)

*Primary Examiner* — Ratisha Mehta
*Assistant Examiner* — Brad A Knudson
(74) *Attorney, Agent, or Firm* — Kilpatrick Townsend & Stockton LLP

(57) ABSTRACT

A method of manufacturing a semiconductor structure and a semiconductor structure are disclosed. The method of manufacturing a semiconductor structure includes: providing a substrate, and forming a first sacrificial layer on the substrate, where the first sacrificial layer includes a first sacrificial dielectric layer and a second sacrificial dielectric layer; patterning the first sacrificial layer, and forming first intermediate pattern structures that are arranged at intervals, where a first gap is provided between two adjacent first intermediate pattern structures; forming a first spacer pad layer in the first gap, where the first spacer pad layer covers sidewalls of each of the two adjacent first intermediate pattern structures and a bottom of the first gap; removing the
(Continued)

first spacer pad layer at the bottom of the first gap, and the second sacrificial dielectric layer; and removing the first sacrificial dielectric layer, to form first pattern structures.

14 Claims, 13 Drawing Sheets

(52) U.S. Cl.
CPC ........ *H01L 21/308* (2013.01); *H01L 21/3081* (2013.01); *H01L 21/3086* (2013.01); *H01L 21/033* (2013.01)

(58) Field of Classification Search
CPC ........... H01L 21/32129; H01L 21/0332; H01L 21/3081; H01L 21/3086
See application file for complete search history.

(56) References Cited

U.S. PATENT DOCUMENTS

| | | | |
|---|---|---|---|
| 2009/0127722 A1 | 5/2009 | Noelscher et al. | |
| 2015/0270264 A1* | 9/2015 | Basker | H01L 29/0649 |
| | | | 257/401 |
| 2018/0277481 A1* | 9/2018 | Cheng | H01L 27/04 |
| 2021/0035803 A1* | 2/2021 | Junhong | H01L 21/3086 |
| 2021/0035981 A1* | 2/2021 | Wada | H01L 21/3086 |
| 2022/0051700 A1* | 2/2022 | Lee | G11C 5/063 |

FOREIGN PATENT DOCUMENTS

| | | | | | |
|---|---|---|---|---|---|
| CN | 104124139 A | | 10/2014 | | |
| CN | 106601602 A | | 4/2017 | | |
| CN | 107464812 A | | 12/2017 | | |
| CN | 108091555 A | | 5/2018 | | |
| CN | 108206131 A | | 6/2018 | | |
| CN | 109003894 A | | 12/2018 | | |
| CN | 109950141 A | | 6/2019 | | |
| CN | 112017947 A | * | 12/2020 | ........... | H01L 21/027 |
| CN | 112133625 A | | 12/2020 | | |
| CN | 113130751 A | | 7/2021 | | |

OTHER PUBLICATIONS

International Search Report cited in PCT/CN2021/112162, mailed Dec. 7, 2021, 10 pages.

* cited by examiner

METHOD OF MANUFACTURING SEMICONDUCTOR STRUCTURE INCLUDING SPACER FILLER ETCH AND STACKED MANDREL LAYERS AND SEMICONDUCTOR STRUCTURE

CROSS-REFERENCE TO RELATED APPLICATIONS

This is a continuation of International Patent Application No. PCT/CN2021/112162, filed on Aug. 12, 2021, which claims the priority to Chinese Patent Application No. 202110229753.X, titled "METHOD OF MANUFACTURING SEMICONDUCTOR STRUCTURE AND SEMICONDUCTOR STRUCTURE" and filed on Mar. 2, 2021. The entire contents of International Patent Application No. PCT/CN2021/112162 and Chinese Patent Application No. 202110229753.X are incorporated herein by reference.

TECHNICAL FIELD

The present disclosure relates to, but is not limited to, a method of manufacturing a semiconductor structure and a semiconductor structure.

BACKGROUND

With the evolution of semiconductor technology nodes and machines, chip manufacturers continue to make attempts to increase the density of devices on wafers due to cost considerations. The increasing density of devices in integrated circuits has led to a continuous decrease in the critical dimension (CD) of semiconductor devices. The critical dimension is approaching the optical-physical limit of photolithography. Mask patterns formed by the existing photolithography process can hardly meet the demand of the continuously decreasing critical dimension of semiconductor devices, which limits the development of the semiconductor technology.

In order to further reduce the size of semiconductor devices based on the existing photolithography process, new manufacturing processes have emerged, such as a self-aligned double patterning (SADP) process. The SADP process consists of a mandrel process and a spacer process, with the principle of forming spacers on both sides of a preset mandrel pattern and then removing the mandrel pattern such that spacer patterns are transferred to a target material layer, thus producing a target pattern.

However, the patterning step in a capacitor process easily causes over-etching of a gap structure between adjacent pattern structures.

SUMMARY

An overview of the subject matter detailed in the present disclosure is provided below, which is not intended to limit the protection scope of the claims.

The present disclosure provides a method of manufacturing a semiconductor structure and a semiconductor structure.

According to a first aspect, the present disclosure provides a method of manufacturing a semiconductor structure, including the following steps: providing a substrate, and forming a first sacrificial layer on the substrate, where the first sacrificial layer includes a first sacrificial dielectric layer and a second sacrificial dielectric layer that are stacked; patterning the first sacrificial layer, and forming first intermediate pattern structures that are arranged at intervals along a first direction, where a first gap is provided between two adjacent first intermediate pattern structures; forming a first spacer pad layer in the first gap, where the first spacer pad layer covers sidewalls of each of the two adjacent first intermediate pattern structures and a bottom of the first gap; removing the first spacer pad layer at the bottom of the first gap, and the second sacrificial dielectric layer; and removing the first sacrificial dielectric layer, to form first pattern structures.

According to a second aspect, the present disclosure provides a semiconductor structure manufactured by using the foregoing method of manufacturing a semiconductor structure.

Other aspects of the present disclosure are understandable upon reading and understanding of the drawings and detailed description.

BRIEF DESCRIPTION OF THE DRAWINGS

The drawings incorporated into the specification and constituting a part of the specification illustrate the embodiments of the present disclosure, and are used together with the descriptions to explain the principles of the embodiments of the present disclosure. In these drawings, similar reference numerals are used to represent similar elements. The drawings in the following description are some rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by a person skilled in the art based on the embodiments of the present application without creative efforts should fall within the protection scope of the present application. It should be noted that without conflict, the embodiments in the present application and features in the embodiments may be combined with each other.

Figure 1:
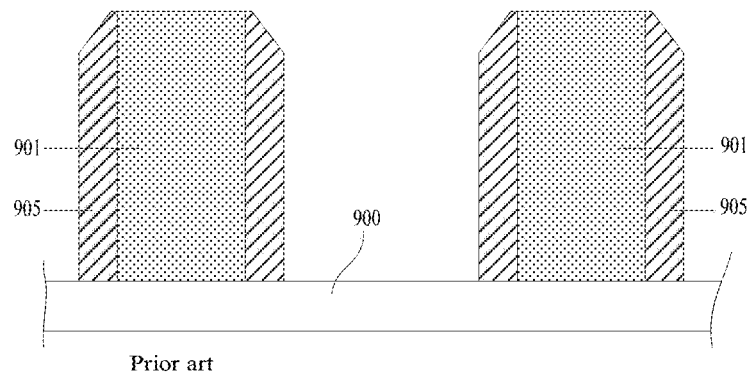
FIG. 1 to FIG. 3 are schematic diagrams of manufacturing a semiconductor structure.

In a capacitor process, multiple pattern structures arranged at intervals are formed, with a gap between two adjacent pattern structures. As shown in FIG. 1, the pattern structures are formed on a dielectric layer 900. Each pattern structure includes a mandrel layer 901 and sidewalls 905 located on both sides of the mandrel layer 901. A gap is provided between two adjacent patterned structures, and the gap exposes the dielectric layer 900.

Figure 2:
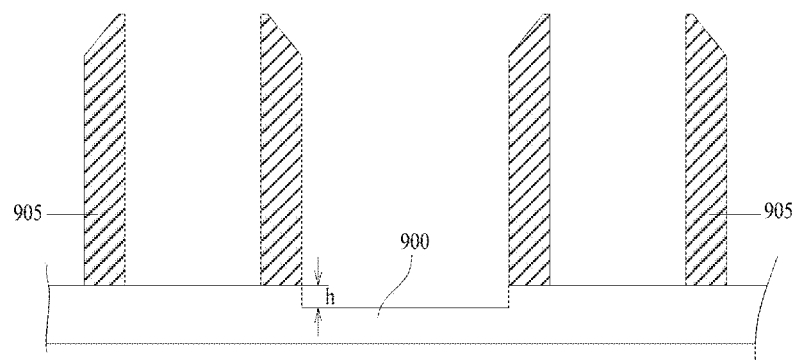
Figure 3:
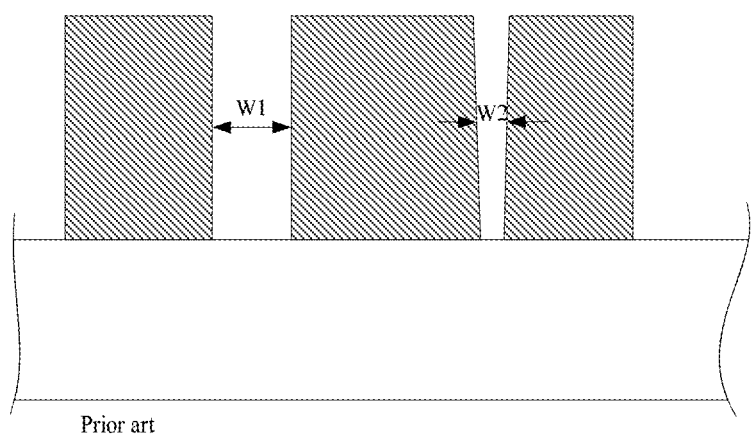

An etching process is performed on the pattern structure. Because the dielectric layer under the gap is exposed without protection, in the etching process, the dielectric layer under the gap is more affected by etching than the mandrel layer. The dielectric layer under the gap will also be partially etched. Therefore, the dielectric layer exposed after the pattern structure is etched has a height difference with the dielectric layer under the gap, thus forming a recess. FIG. 2 is a schematic diagram of the recess between the dielectric layer under the pattern structure and the dielectric layer under the gap after the etching process. As shown in FIG. 2, there is a drop h between the dielectric layer 900 exposed after the mandrel layer in the pattern structure is etched and the dielectric layer 900 under the gap. The drop h causes a recess in the gap, which will lead to a height difference between adjacent patterns. As a result, the pattern structures are not effectively transferred to a target layer during the subsequent pattern transfer, resulting in ineffective bridging or non-open defects of the pattern formed on a target structure. FIG. 3 is a schematic diagram of a defect caused by an etch loading effect. As shown in FIG. 3, the etch loading effect may cause the bottom surface of the semiconductor structure to have a narrow open or even non-open defect. For example, the left side is a normal open size W1, and the right side is a narrow open size W2, where W2 is significantly narrower than W1.

A method of manufacturing a semiconductor structure and a semiconductor structure manufactured by the method are disclosed, which can eliminate the pattern transfer defects (such as bridging or non-open defects) caused by the height difference between adjacent patterns due to the etch loading effect between the pattern structure and the gap, thereby improving the stability of the subsequent process and the performance of the product.

Figure 4:
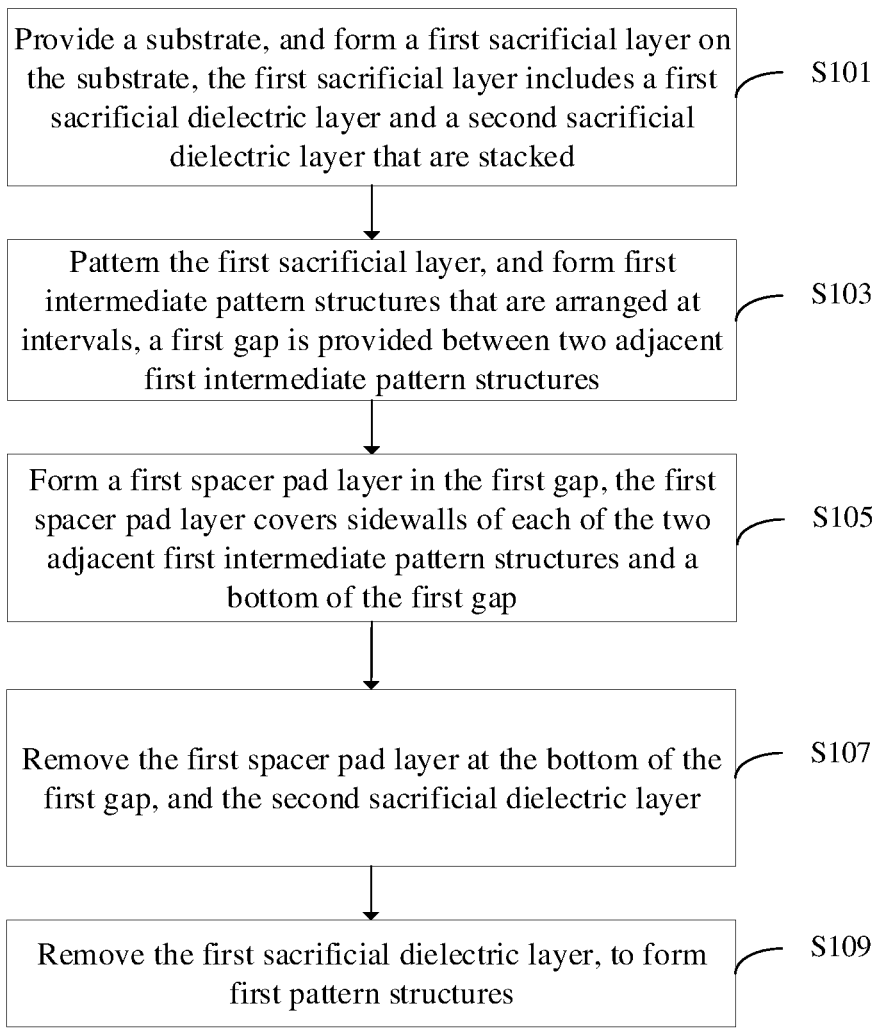
FIG. 4 is a schematic flowchart of an embodiment of a method of manufacturing a semiconductor structure according to the present disclosure.

FIG. 4 is a schematic flowchart of an embodiment of a method of manufacturing a semiconductor structure according to the present disclosure. As shown in FIG. 4, the method of manufacturing a semiconductor structure includes the following steps:

Step S101: Provide a substrate, and form a first sacrificial layer on the substrate, the first sacrificial layer including a first sacrificial dielectric layer and a second sacrificial dielectric layer that are stacked.

Step S103: Pattern the first sacrificial layer, and form first intermediate pattern structures that are arranged at intervals, a first gap being provided between two adjacent first intermediate pattern structures.

Step S105: Form a first spacer pad layer in the first gap, the first spacer pad layer covering sidewalls of each of the two adjacent first intermediate pattern structures and the bottom of the first gap.

Step S107: Remove the first spacer pad layer at the bottom of the first gap, and the second sacrificial dielectric layer.

Step S109: Remove the first sacrificial dielectric layer, to form first pattern structures.

The method of manufacturing a semiconductor structure is described in detail below with reference to the accompanying drawings.

Step S101 is performed to provide a substrate, and form a first sacrificial layer on the substrate, the first sacrificial layer including a first sacrificial dielectric layer and a second sacrificial dielectric layer that are stacked.

In an embodiment of the present disclosure, the semiconductor structure is manufactured using a double patterning process, which may be, for example, a self-aligned double patterning (SADP) process.

In the SADP process, for example, the substrate has a stack of known patterned layers with self-aligned double patterning. The substrate may include monocrystalline silicon, an oxide layer, a polysilicon layer, silicon germanide, silicon on insulator, etc., and the substrate may also include a stack combination structure of multiple materials, such as a combination of silicon nitride, silicon oxide, silicon carbon nitride, and silicon oxynitride, etc.

Figure 5:
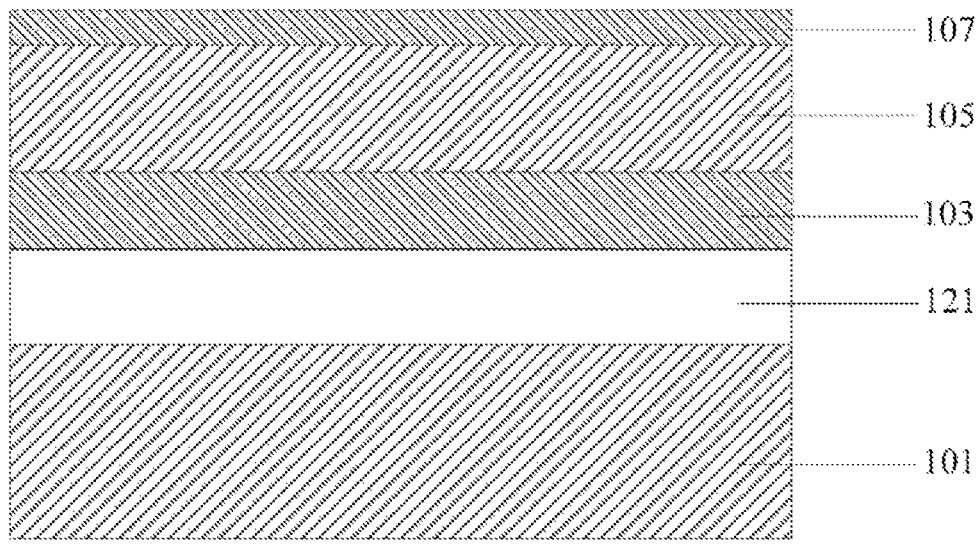
FIG. 5 to FIG. 14 are schematic diagrams of structure variations of a semiconductor structure manufactured according to steps in FIG. 4.

In an embodiment of the present disclosure, in step S101, a substrate is provided, and a first sacrificial layer is formed on the substrate, the first sacrificial layer including a first sacrificial dielectric layer and a second sacrificial dielectric layer that are stacked, thus obtaining the structure shown in FIG. 5.

In the structure shown in FIG. 5, as a schematic illustration, only a base layer 101 of the substrate is shown. The base layer 101 may be a single-layer structure or a multilayer structure, and may be formed by a spin-on hardmask (SOH) layer. The SOH layer may be formed through a spin coating process. The SOH layer may be an insulating layer of a carbon-hydrogen ($C_xH_y$) system, which may include a silicon hard mask material, a carbon hard mask material, and an organic hard mask material, etc.

In some examples, a support layer 103 may be formed on the base layer 101. A material of the support layer 103 may include, but is not limited to, silicon oxynitride (SiON), a nitrogen-doped silicon carbide layer, or a silicon carbide layer, etc. The support layer 103 may be formed by a chemical vapor deposition (CVD) or spin-on dielectrics (SOD) process.

In step S101, a first sacrificial layer is formed on the substrate, where the first sacrificial layer includes a first sacrificial dielectric layer and a second sacrificial dielectric layer that are stacked. As shown in FIG. 5, a first sacrificial dielectric layer 105 and a second sacrificial dielectric layer 107 are formed on the support layer 103 in order. The first sacrificial dielectric layer 105 may be formed by a spin-on hardmask (SOH) layer. The SOH layer may be formed through a spin coating process. The SOH layer may be an insulating layer of a carbon-hydrogen ($C_xH_y$) system, which may include a silicon hard mask material, a carbon hard mask material, or an organic hard mask material, etc., such as a silicon oxynitride layer. A material of the second sacrificial dielectric layer 107 may include, but is not limited to, silicon oxynitride (SiON), polysilicon (Poly), an amorphous carbon layer (ACL), and oxide, etc. In this embodiment, the material of the second sacrificial dielectric layer 107 is the same as that of the support layer 103. The second sacrificial dielectric layer 107 may be formed by a chemical vapor deposition (CVD) or spin-on dielectrics (SOD) process.

The structure shown in FIG. 5 is obtained through the foregoing step S101.

Step S103 is performed, to pattern the first sacrificial layer and form the first intermediate pattern structures that are arranged at intervals along a first direction, the first gap being provided between two adjacent first intermediate pattern structures.

Figure 6:
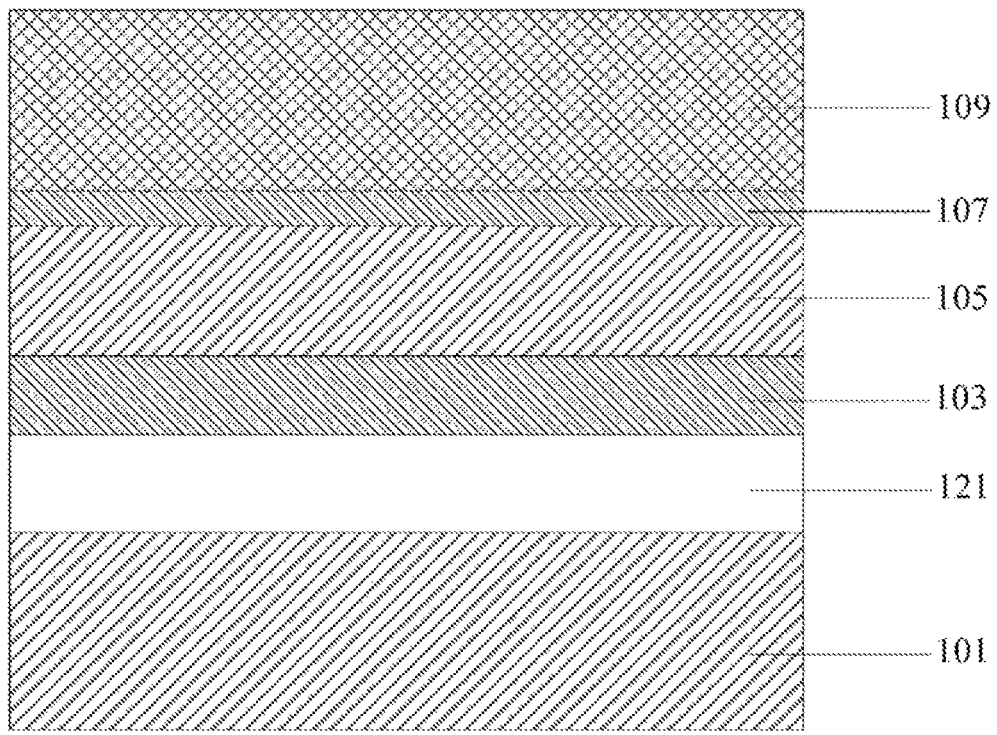

In an embodiment of the present disclosure, in step S103, a mask layer 109 is first formed on the second sacrificial dielectric layer 107 to obtain the structure shown in FIG. 6.

The mask layer 109 is formed on the second sacrificial dielectric layer 107; the mask layer 109 is formed on the surface of the second sacrificial dielectric layer 107 by a chemical vapor deposition process. A material of the mask layer 109 may include, but is not limited to, silicon oxynitride (SiON), polysilicon (Poly), an amorphous carbon layer (ACL), or oxide, etc.

Figure 7:
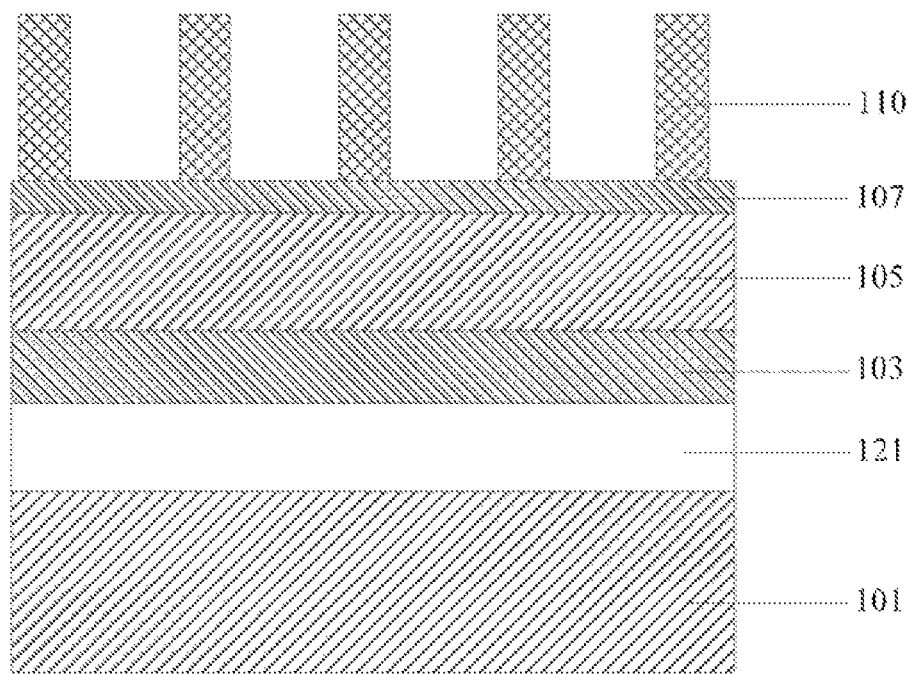

The mask layer 109 is patterned to form mask patterns 110. The mask patterns 110 include multiple line openings spaced apart, which are arranged along the first direction, and the line openings expose part of the second sacrificial dielectric layer 107, thus obtaining the structure shown in FIG. 7.

A patterned photoresist layer is formed on the surface of the mask layer 109. Photoresist is spin-coated on the mask layer 109 and is patterned with a mask plate to form the patterned photoresist layer. The mask layer 109 is etched by using the patterned photoresist layer to form multiple mask patterns 110 on the second sacrificial dielectric layer 107, a line opening along the first direction being provided between two adjacent mask patterns 110. The line openings expose part of the second sacrificial dielectric layer 107. The process for forming the mask patterns 110 is not limited thereto. In other examples, the mask patterns 110 can also be formed on the surface of the second sacrificial dielectric layer 107 by the SADP process.

Figure 8:
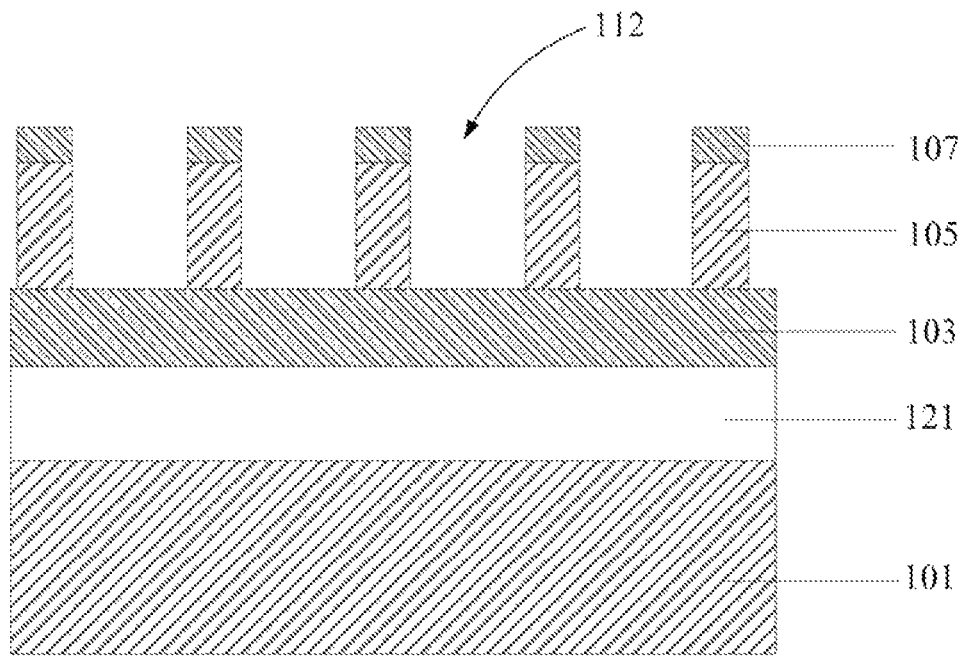

The process is continued. The second sacrificial dielectric layer 107 and the first sacrificial dielectric layer 105 are etched along the mask patterns 110 to form the first intermediate pattern structures, a first gap 112 being provided between two adjacent first intermediate pattern structures, thus obtaining the structure shown in FIG. 8. As shown in FIG. 8, the etched second sacrificial dielectric layer 107 and first sacrificial dielectric layer 105 form the first intermediate pattern structures.

Step S105 is performed to form the first spacer pad layer in the first gap, the first spacer pad layer covering sidewalls of each of the two adjacent first intermediate pattern structures and the bottom of the first gap.

Figure 9:
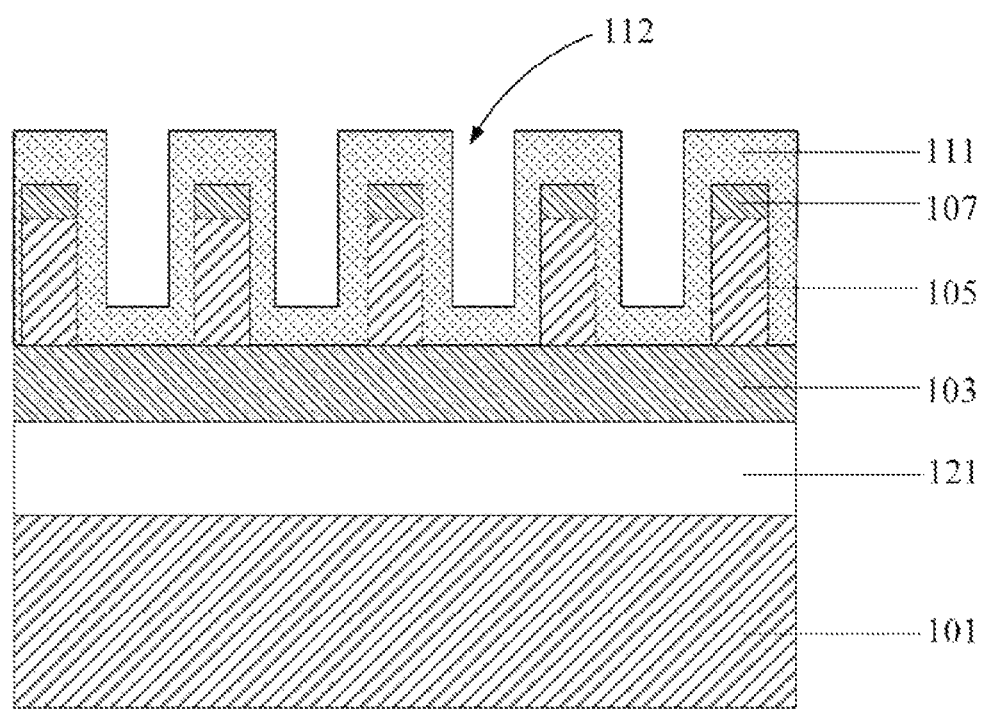

In an embodiment of the present disclosure, in step S105, a first pad layer 111 is formed, and the first pad layer 111 covers each first intermediate pattern structure and each first gap, to obtain the structure shown in FIG. 9.

The first pad layer 111 may be formed by an oxide layer, and the first pad layer 111 may be formed through a spin coating process. The first pad layer 111 covers sidewalls of each first intermediate pattern structure and the bottom of each first gap 112. The first pad layer 111 completely covers the first intermediate pattern structures and the first gaps 112, and has a thickness ranging from 50 nm to 150 nm, such as 70 nm, 75 nm, 80 nm, 85 nm, 90 nm, 95 nm, 100 nm, or any value from 50 nm to 150 nm. The thickness of the first pad layer 111 is not limited thereto, but can vary depending on the size of the first intermediate pattern structure or the first gap, as long as it can completely cover the first intermediate pattern structures and the first gaps 112. The first pad layer 111 can also be formed, for example, by photoresist or amorphous silicon.

The first pad layer 111 covering the top of the first intermediate pattern structure is removed to expose the second sacrificial dielectric layer 107, and the first pad layer 111 on the sidewalls of the first intermediate pattern structure and at the bottom of the first gap 112 is retained to form the first spacer pad layer 111A.

Figure 10:
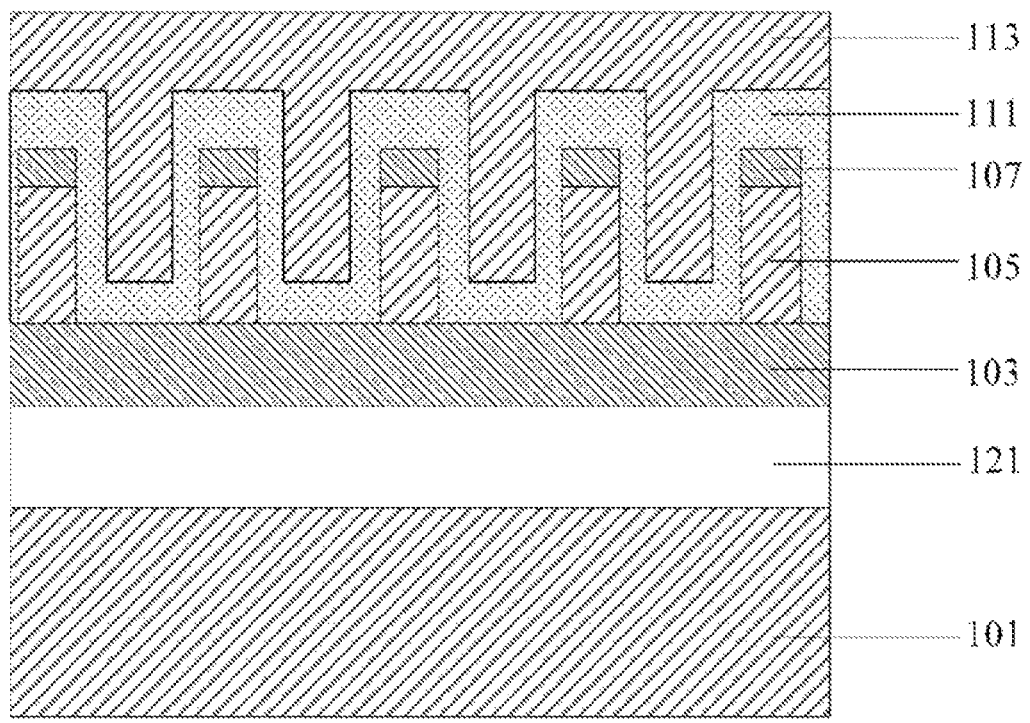

The step of removing the first pad layer covering the top of the first intermediate pattern structure to expose the second sacrificial dielectric layer, and retaining the first pad layer on the sidewalls of the first intermediate pattern structure and at the bottom of the first gap to form the first spacer pad layer further includes:

forming a first filling layer 113 covering the first pad layer 111 to obtain the structure shown in FIG. 10.

The first filling layer 113 may be formed by a spin-on hardmask (SOH) layer. The SOH layer may be formed through a spin coating process. The SOH layer may be an insulating layer of a carbon-hydrogen ($C_xH_y$) system, which may include a silicon hard mask material, a carbon hard mask material, and an organic hard mask material, etc. In an embodiment, a material of the first filling layer 113 may be the same as that of the first sacrificial dielectric layer 105. The first filling layer 113 may be, for example, a silicon oxynitride layer.

The first filling layer 113 completely covers the first pad layer 111. The first filling layer 113 may also be formed, for example, by photoresist or amorphous silicon.

Figure 11:
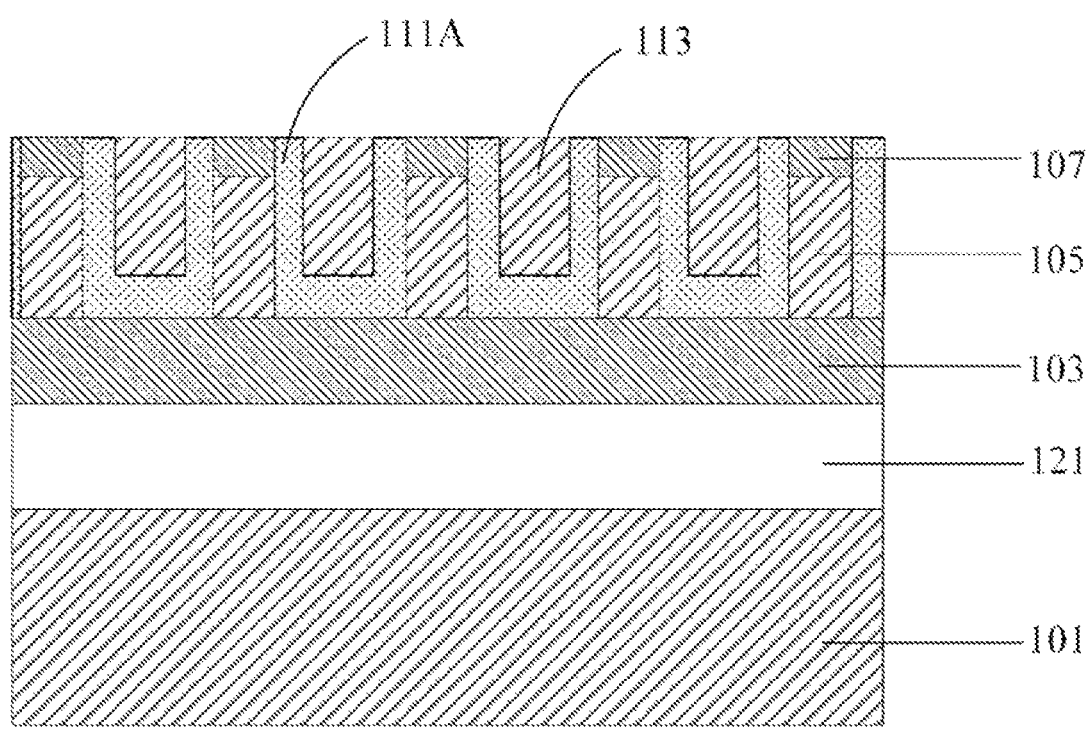

The first filling layer 113 above the second sacrificial dielectric layer 107, and the first pad layer 111 above the second sacrificial dielectric layer 107 are removed, by using the second sacrificial dielectric layer 107 as a stop layer, to obtain the structure shown in FIG. 11.

Figure 12:
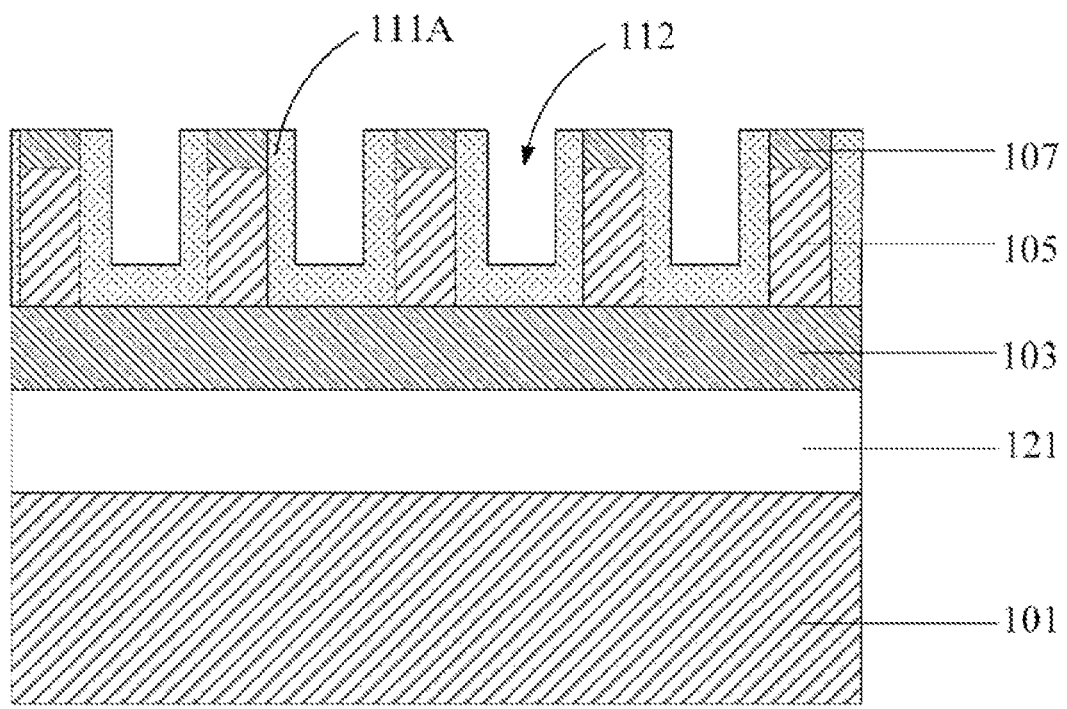

The first filling layer 113 between parts of the first pad layer 111 is removed to form the first spacer pad layer 111A, thus obtaining the structure shown in FIG. 12.

Step S107 is performed to remove the first spacer pad layer at the bottom of the first gap, and the second sacrificial dielectric layer.

Figure 13:
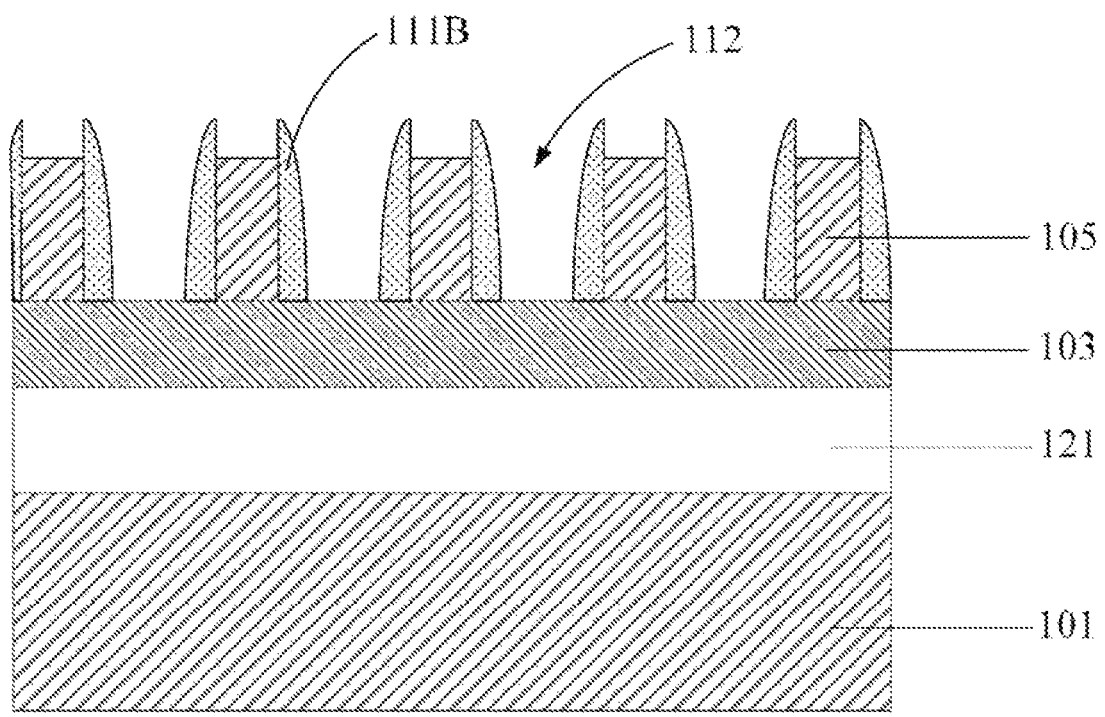

In an embodiment of the present disclosure, in step S107, the first spacer pad layer 111A at the bottom of the first gap 112, and the second sacrificial dielectric layer 107 are removed, to obtain the structure shown in FIG. 13. The first spacer pad layer 111A at the bottom of the first gap 112, and the second sacrificial dielectric layer 107 can be removed simultaneously.

Step S109 is performed to remove the first sacrificial dielectric layer, thus forming the first pattern structures.

Figure 14:
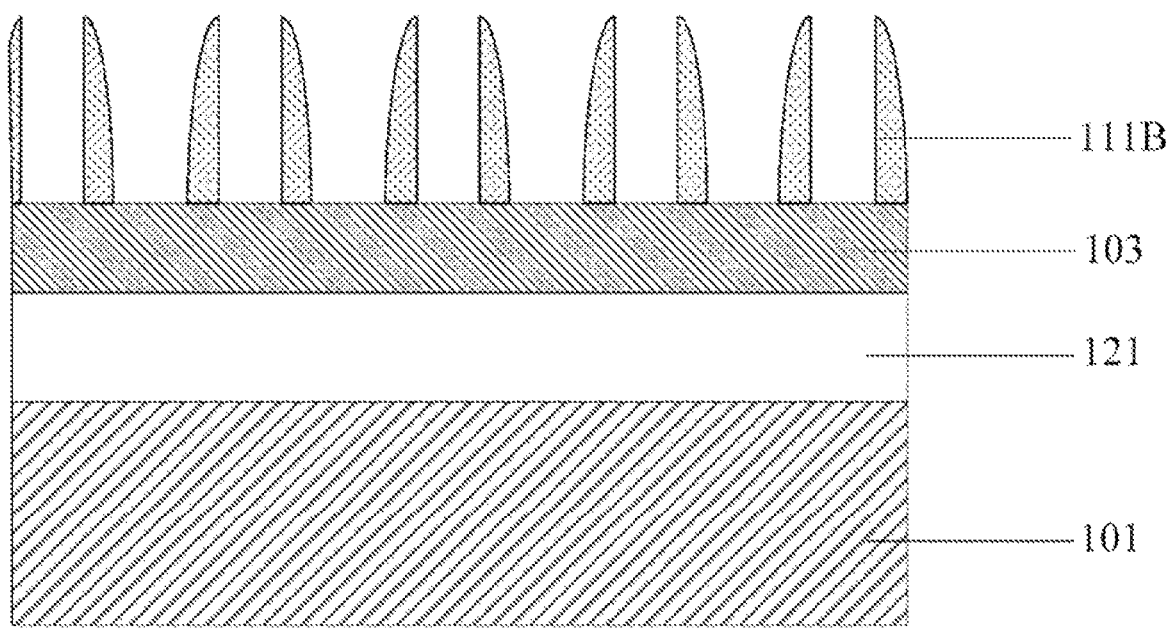

In an embodiment of the present disclosure, in step S109, the first sacrificial dielectric layer 105 is removed to form the first pattern structures 111B, thus obtaining the structure shown in FIG. 14.

In an embodiment, the first spacer pad layer has a first line width and the first gap has a second line width, where the second line width is at least three times the first line width, i.e., the second line width is three times or more than the first line width.

In an embodiment, the line width of the first spacer pad layer may be equal to the first line width. In an embodiment of the present disclosure, the line width of the first spacer pad layer can be made smaller due to the presence of the second sacrificial dielectric layer, such that the target pattern can be made larger in the same area.

As shown in FIG. 14, the support layer under the first pattern structure 111B formed after step S109 has substantially the same thickness as the support layer under the first gap, with no or negligible difference, which effectively overcomes the etch loading effect. The semiconductor structure can be effectively patterned to ensure the performance of the semiconductor structure.

Figure 15:
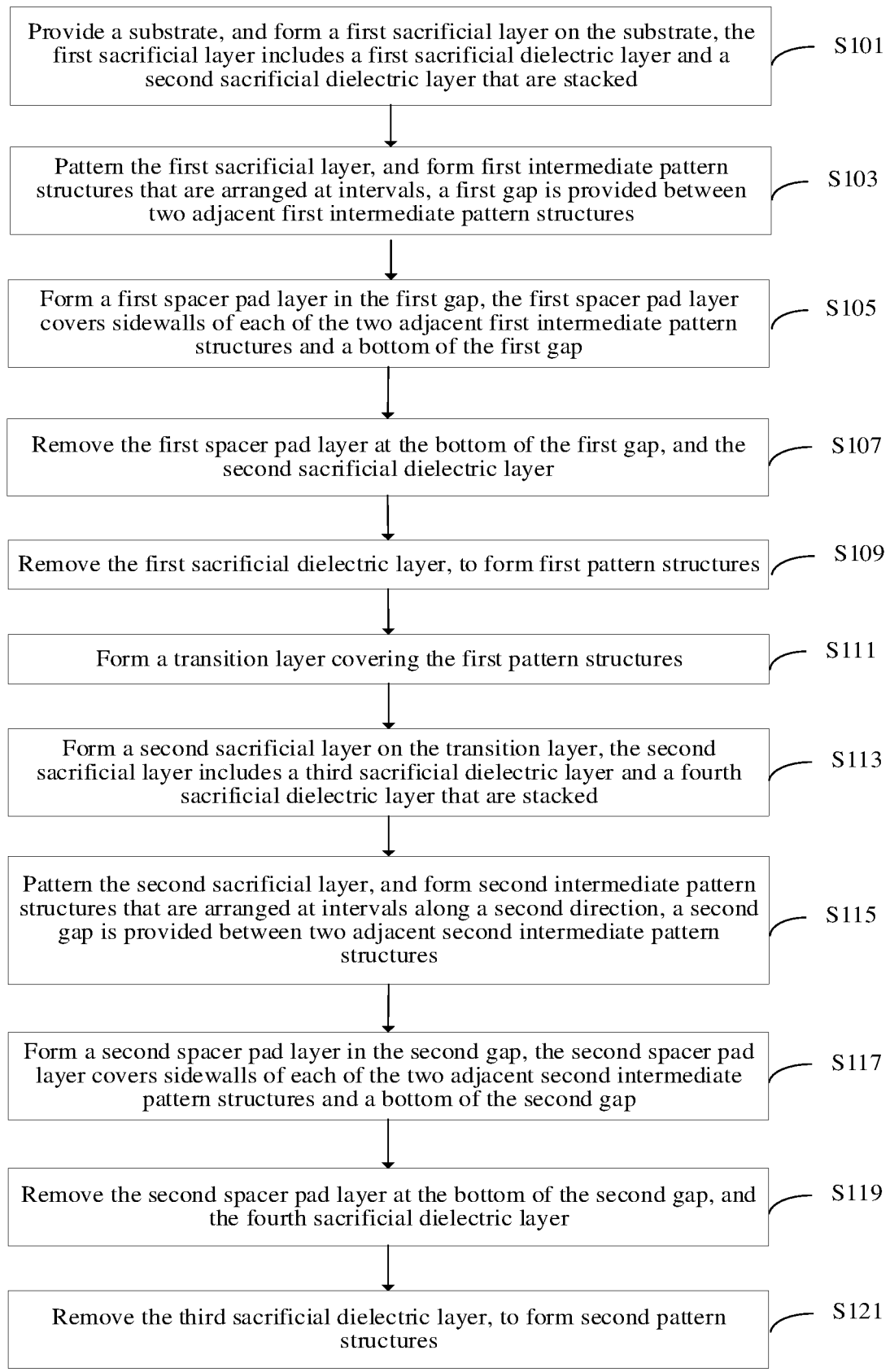
FIG. 15 is a schematic flowchart of an embodiment of a method of manufacturing a semiconductor structure according to the present disclosure.

FIG. 15 is a schematic flowchart of an embodiment of a method of manufacturing a semiconductor structure according to the present disclosure.

In an embodiment of the present disclosure, after obtaining the first pattern structures 111B are obtained, step S111 is performed to form a transition layer covering the first pattern structures.

Figure 16:
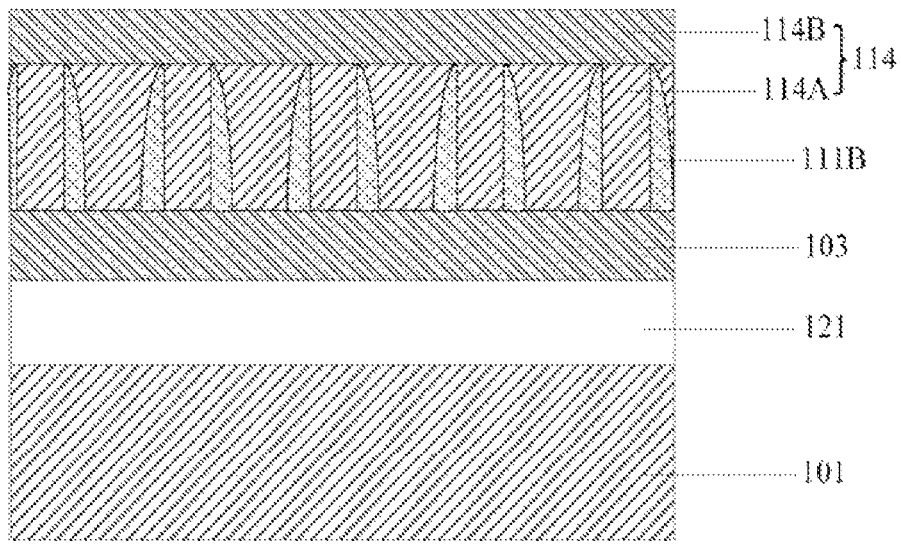
FIG. 16 to FIG. 25 are schematic diagrams of structure variations of a semiconductor structure manufactured according to steps in FIG. 15.

In an embodiment of the present disclosure, in step S111, a transition layer 114 is formed on the first pattern structures 111B, and the transition layer 114 completely covers the first pattern structures 111B, thus obtaining the structure shown in FIG. 16.

The transition layer 114 may be formed by a chemical vapor deposition (CVD) or spin-on dielectrics (SOD) process. A material of the transition layer 114 may include, but is not limited to, silicon oxynitride (SiON), a nitrogen-doped silicon carbide layer, or a silicon carbide layer, etc.

In an embodiment of the present disclosure, as shown in FIG. 16, the transition layer 114 includes a first transition dielectric layer 114A and a second transition dielectric layer 114B stacked in order, where the first transition dielectric layer 114A completely covers the first pattern structures 111B. The second transition dielectric layer 114B is formed on the first transition dielectric layer 114A. A material of the first transition dielectric layer 114A may be SOH; a material of the second transition dielectric layer 114B may be silicon oxynitride. The materials of the first transition dielectric layer 114A and the second transition dielectric layer 114B are not limited thereto, and can be selected according to the etching conditions.

Step S113 is performed to form a second sacrificial layer on the transition layer, the second sacrificial layer including a third sacrificial dielectric layer and a fourth sacrificial dielectric layer that are stacked.

Figure 17:
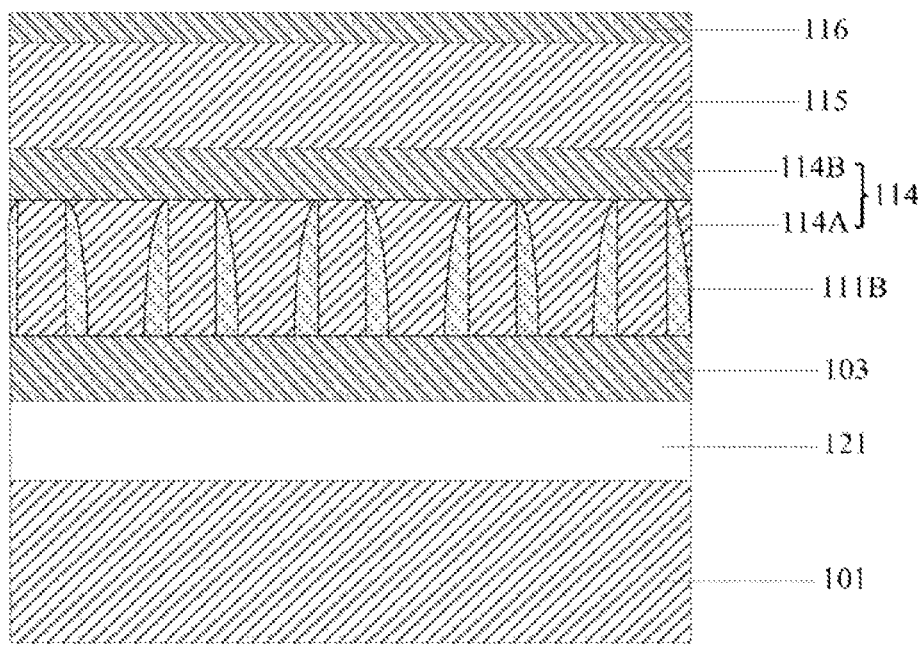

In an embodiment of the present disclosure, in step S111, a third sacrificial dielectric layer 115 and a fourth sacrificial dielectric layer 116 are formed on the transition layer 114 in order. The third sacrificial dielectric layer 115 and the fourth sacrificial dielectric layer 116 form the second sacrificial layer, thus obtaining the structure shown in FIG. 17.

The third sacrificial dielectric layer 115 may be formed by a spin-on hardmask (SOH) layer. The SOH layer may be formed through a spin coating process. The SOH layer may be an insulating layer of a carbon-hydrogen ($C_xH_y$) system, which can include a silicon hard mask material, a carbon hard mask material, and an organic hard mask material, etc., such as a silicon oxynitride layer. A material of the fourth sacrificial dielectric layer 116 may include, but is not limited to, silicon oxynitride (SiON), polysilicon (Poly), an amorphous carbon layer (ACL), oxide, etc. In this embodiment, the material of the third sacrificial dielectric layer 115 is the same as that of the first transition dielectric layer 114A, and the material of the fourth sacrificial dielectric layer 116 is the same as that of the second transition dielectric layer 114B. The fourth sacrificial dielectric layer 116 may be formed by a chemical vapor deposition (CVD) or spin-on dielectrics (SOD) process.

Step S115 is performed to pattern the second sacrificial layer, and form second intermediate pattern structures that are arranged at intervals along a second direction, a second gap being provided between two adjacent second intermediate pattern structures. The second direction is different from the first direction; the first direction and the second direction may intersect vertically or at an angle.

Figure 18:
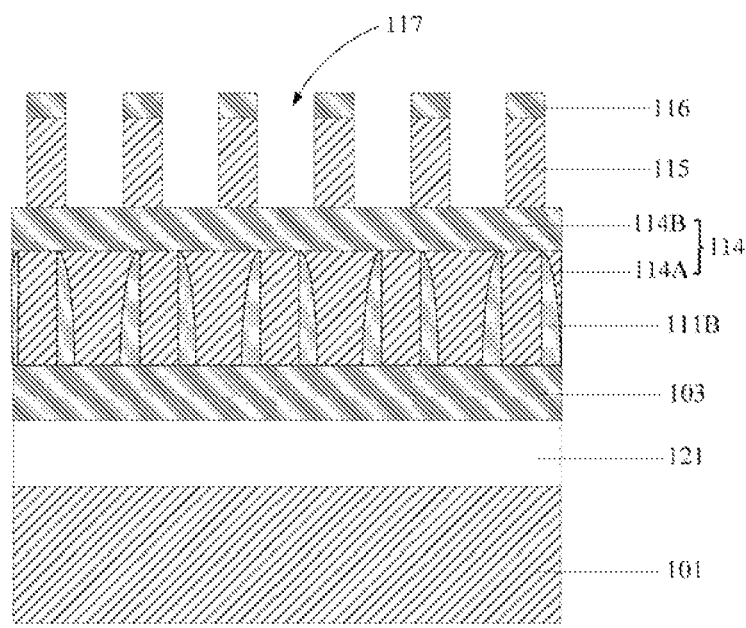

In an embodiment of the present disclosure, in step S115, the second sacrificial layer is patterned to form the second intermediate pattern structures that are arranged at intervals along the second direction, a second gap 117 being provided between two adjacent second intermediate pattern structures, thus obtaining the structure shown in FIG. 18.

With respect to step S115, in an embodiment of the present disclosure, in step S115, a mask layer is first formed on the fourth sacrificial dielectric layer 116. A mask layer is formed on the surface of the fourth sacrificial dielectric layer 116 by using a chemical vapor deposition process. A material of the mask layer may include, but is not limited to, silicon oxynitride (SiON), polysilicon (Poly), an amorphous carbon layer (ACL), oxide, etc.

The mask layer is patterned to form mask patterns. The mask patterns include multiple line openings spaced apart, which are arranged along the second direction, and the line openings expose part of the fourth sacrificial dielectric layer 116.

A patterned photoresist layer is formed on the surface of the mask layer. Photoresist is spin-coated on the mask layer and is patterned with a mask plate to form the patterned photoresist layer. The mask layer is etched by using the patterned photoresist layer to form multiple mask patterns on the fourth sacrificial dielectric layer 116, a line opening along the second direction being provided between two adjacent mask patterns. The line openings expose part of the fourth sacrificial dielectric layer 116. The second direction intersects the first direction. The second direction and the first direction may intersect vertically or at an angle. In other embodiments, mask patterns can be formed on the surface of the fourth sacrificial dielectric layer 116 by the SADP process.

The fourth sacrificial dielectric layer 116 and the third sacrificial dielectric layer 115 are etched along the mask patterns, to form the second intermediate pattern structures, a second gap 117 being provided between two adjacent second intermediate pattern structures, thus obtaining the structure shown in FIG. 18. As shown in FIG. 18, the etched fourth sacrificial dielectric layer 116 and third sacrificial dielectric layer 115 form the second intermediate pattern structures.

Step S117 is performed to form a second spacer pad layer in the second gap, the second spacer pad layer covering sidewalls of each of the two adjacent second intermediate pattern structures and the bottom of the second gap.

Figure 19:
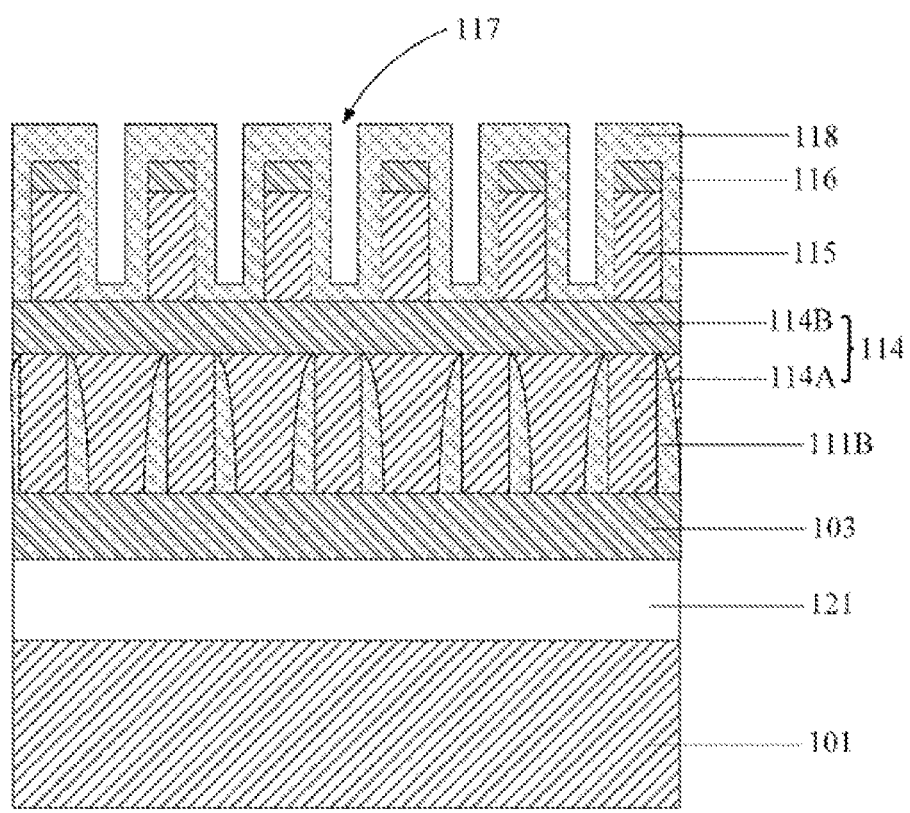

In an embodiment of the present disclosure, in step S117, a second pad layer 118 is formed, and the second pad layer 118 covers each second intermediate pattern structure and each second gap 117, as shown in FIG. 19.

The second pad layer 118 may be formed by an oxide layer, and the second pad layer 118 may be formed through a spin coating process. The second pad layer 118 completely covers the second intermediate pattern structures and the second gaps 117, and has a thickness ranging from 50 nm to 150 nm, such as 70 nm, 75 nm, 80 nm, 85 nm, 90 nm, 95 nm, 100 nm, or any value from 50 nm to 150 nm. The thickness of the second pad layer 118 is not limited thereto, but can vary depending on the size of the second intermediate pattern structure or the second gap 117, as long as it can completely cover the second intermediate pattern structures and the second gaps 117. The second pad layer 118 can also be formed, for example, by photoresist or amorphous silicon.

Figure 21:
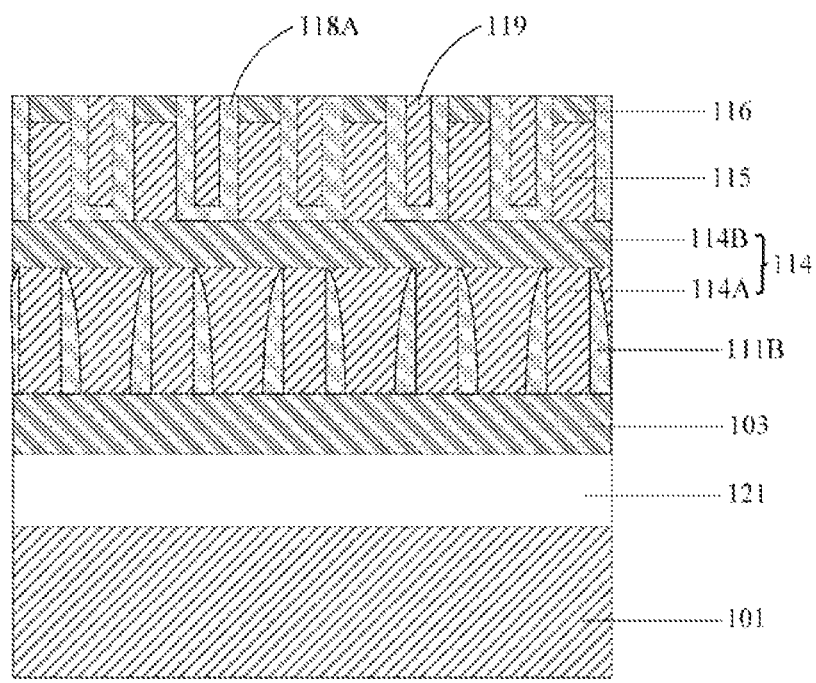

The second pad layer 118 covering the top of each second intermediate pattern structure is removed to expose the fourth sacrificial dielectric layer 116, and the second pad layer 118 on the sidewalls of the second intermediate pattern structure and at the bottom of the second gap 117 is retained, to form the second spacer pad layer 118A (as shown in FIG. 21).

Figure 20:
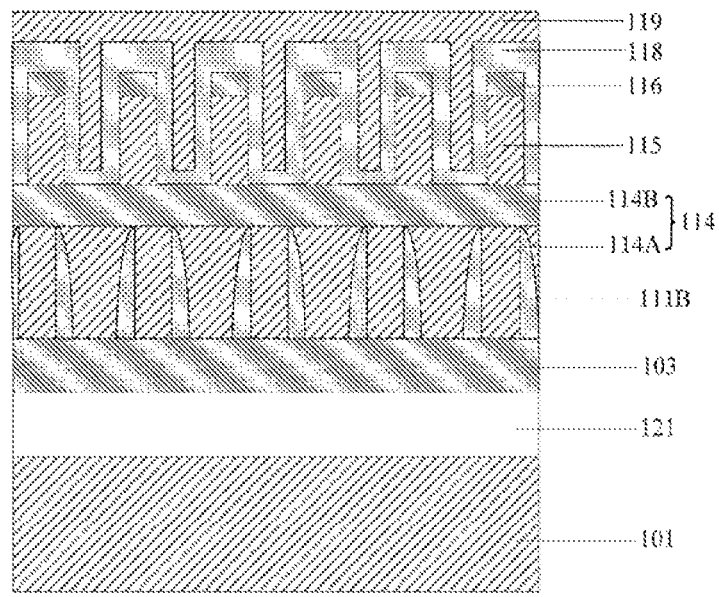

The step of removing the second pad layer covering the top of each second intermediate pattern structure to expose the fourth sacrificial dielectric layer, and retaining the second pad layer on the sidewalls of the second intermediate pattern structure and at the bottom of the second gap to form the second spacer pad layer further includes:

forming a second filling layer 119 covering the second pad layer 118, to obtain the structure shown in FIG. 20.

The second filling layer 119 may be formed by a spin-on hardmask (SOH) layer. The SOH layer may be formed through a spin coating process. The SOH layer may be an insulating layer of a carbon-hydrogen ($C_xH_y$) system, which may include a silicon hard mask material, a carbon hard mask material, and an organic hard mask material, etc. In an embodiment, a material of the second filling layer 119 may be the same as that of the third sacrificial dielectric layer 115. The second filling layer 119 may be a silicon oxynitride layer.

The second filling layer 119 completely covers the second pad layer 118. The second filling layer 119 may also be formed, for example, by photoresist or amorphous silicon.

The second filling layer 119 above the fourth sacrificial dielectric layer 116, and the second pad layer 118 above the fourth sacrificial dielectric layer 116 are removed, by using the fourth sacrificial dielectric layer 116 as the stop layer, to obtain the structure shown in FIG. 21.

Figure 22:
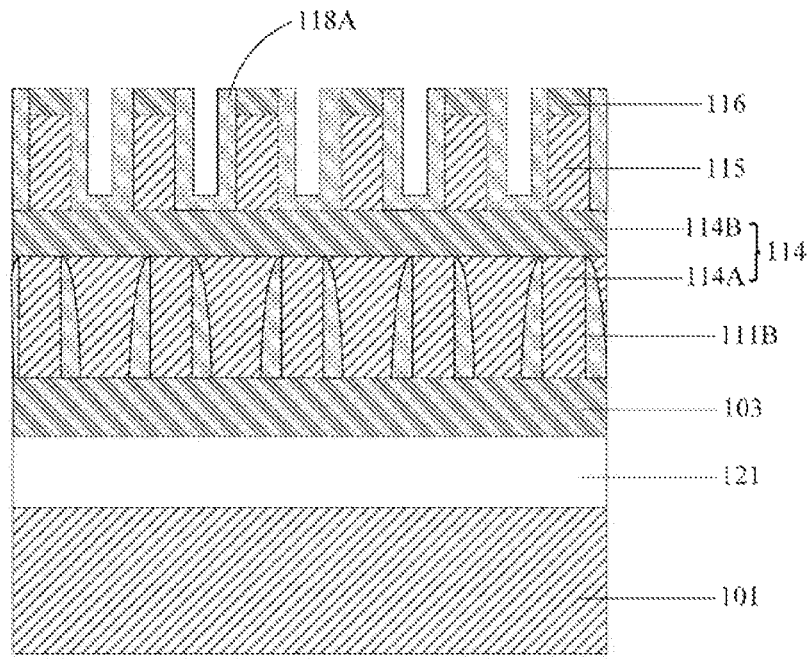

The second filling layer 119 between the second pad layer 118 is removed to form the second spacer pad layer 118A, thus obtaining the structure shown in FIG. 22.

Step S119 is performed to remove the second spacer pad layer at the bottom of the second gap, and the fourth sacrificial dielectric layer.

Figure 23:
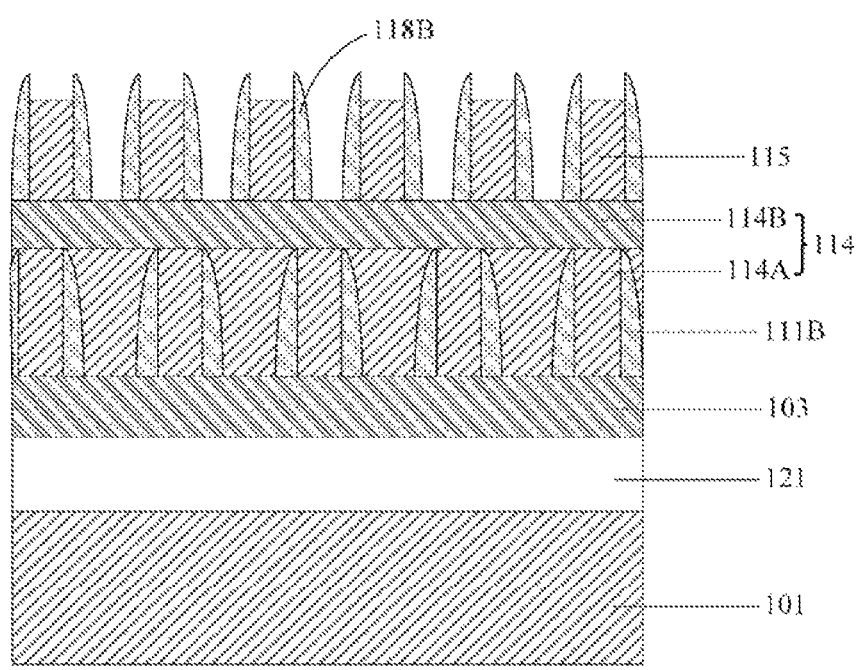

In an embodiment of the present disclosure, in step S119, the second spacer pad layer 118A at the bottom of the second gap 117, and the fourth sacrificial dielectric layer 116 are removed to obtain the structure shown in FIG. 23. The second spacer pad layer 118A at the bottom of the second gap 117, and the fourth sacrificial dielectric layer 116 can be removed simultaneously to obtain the structure shown in FIG. 23.

Step S121 is performed to remove the third sacrificial dielectric layer to form second pattern structures.

Figure 24:
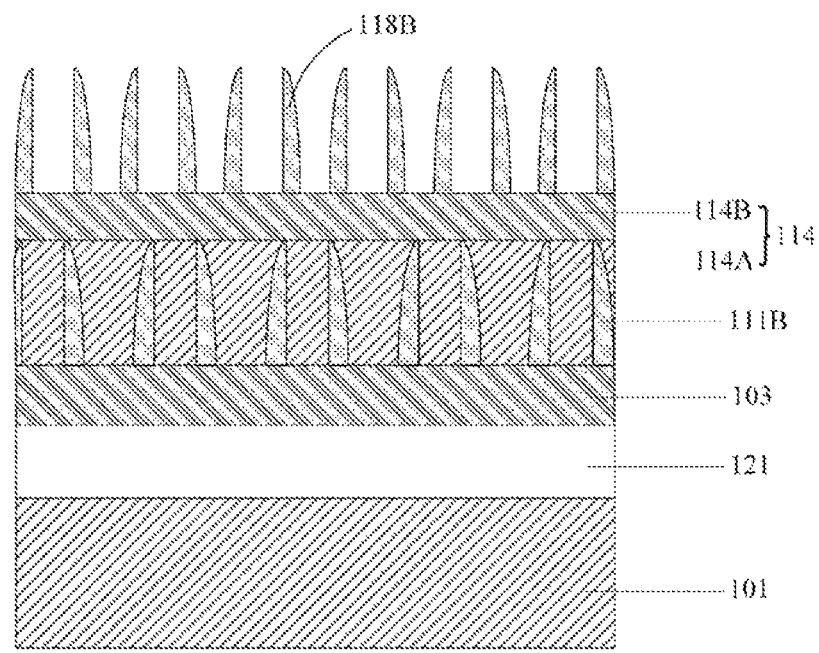

In an embodiment of the present disclosure, in step S121, the third sacrificial dielectric layer 115 is removed to form the second pattern structures 118B, thus obtaining the structure shown in FIG. 24.

In an embodiment, the second spacer pad layer has a third line width and the second gap has a fourth line width, where the fourth line width is at least three times the third line width, i.e., the fourth line width is three times or more than the third line width.

In an embodiment of the present disclosure, the second line width is equal to the fourth line width, and the first line width is equal to the third line width.

In an embodiment of the present disclosure, the line width of the second spacer pad layer may be equal to the third line width.

In an embodiment of the present disclosure, the line width of the second spacer pad layer can be made smaller due to the presence of the fourth sacrificial dielectric layer 116, and the target pattern can be made larger in the same area.

In an embodiment of the present disclosure, a target layer 121 is further formed on the substrate. The target layer 121 is formed on top of the substrate and under the support layer 103. After the first pattern structures 111B and the second pattern structures 118B are formed, the first pattern structures 111B and the second pattern structures 118B are transferred to the target layer 121 as a combined pattern, to obtain the target pattern.

Figure 25:
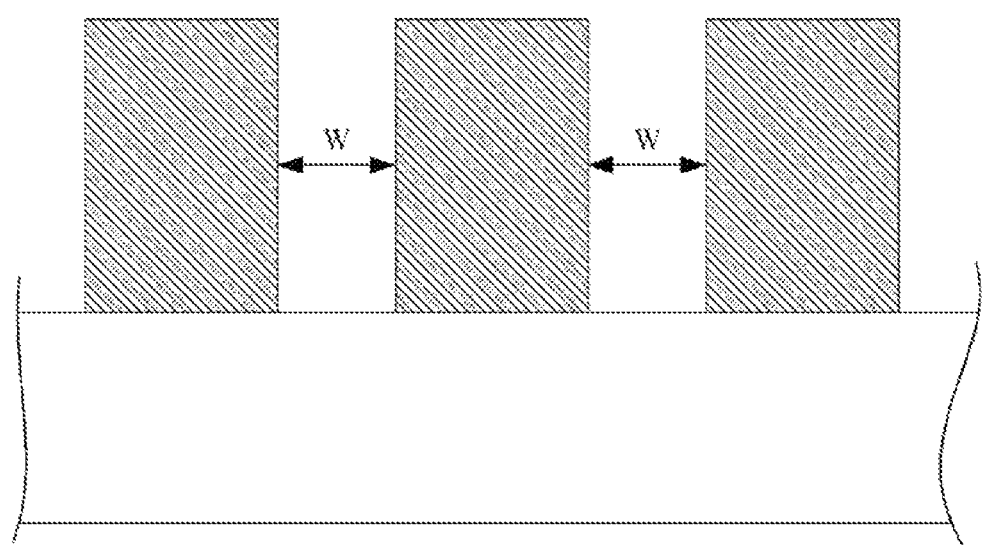

In an embodiment of the present disclosure, the target pattern may be a pattern of capacitive holes arranged at intervals, as shown in FIG. 25.

The present disclosure further provides a semiconductor structure, which can be made by using the foregoing method of manufacturing a semiconductor structure.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

INDUSTRIAL APPLICABILITY

The embodiments of the present disclosure provide a method of manufacturing a semiconductor structure and a semiconductor structure, which can eliminate the pattern transfer defect caused by a height difference between adjacent patterns due to an etch loading effect between the pattern structure and the gap.

The invention claimed is:

1. A method of manufacturing a semiconductor structure, comprising the following steps:
   providing a substrate, and forming a first sacrificial layer on the substrate, the first sacrificial layer comprising a first sacrificial dielectric layer and a second sacrificial dielectric layer that are stacked;
   patterning the first sacrificial layer, and forming first intermediate pattern structures that are arranged at intervals along a first direction, a first gap being provided between each of the first intermediate pattern structures;
   forming a first pad layer, wherein the first pad layer covers surfaces of the first intermediate pattern structures and the first gap;
   forming a first filling layer covering the first pad layer;
   removing the first filling layer above the second sacrificial dielectric layer and the first pad layer above the second sacrificial dielectric layer, by using the second sacrificial dielectric layer as a stop layer;
   removing the first filling layer between parts of the first pad layer, retaining the first pad layer on the sidewalls of each of the first intermediate pattern structures and at a bottom of the first gap to form a first spacer pad layer, the first spacer pad layer covering sidewalls of each of the first intermediate pattern structures and the bottom of the first gap;
   removing the first spacer pad layer at the bottom of the first gap, and the second sacrificial dielectric layer; and
   removing the first sacrificial dielectric layer, to form first pattern structures.

2. The method of claim 1, wherein the substrate further comprises a support layer, and the first sacrificial dielectric layer is formed on the support layer.

3. The method of claim 2, wherein a material of the support layer is the same as a material of the second sacrificial dielectric layer, and the first sacrificial dielectric layer and the second sacrificial dielectric layer have etching selectivity.

4. The method of to claim 2, wherein after the first pattern structures are formed, the method further comprises the following steps:
   forming a transition layer covering the first pattern structures;
   forming a second sacrificial layer on the transition layer, wherein the second sacrificial layer comprises a third sacrificial dielectric layer and a fourth sacrificial dielectric layer that are stacked;
   patterning the second sacrificial layer, to form second intermediate pattern structures that are arranged at intervals along a second direction, a second gap being provided between each of the second intermediate pattern structures;
   forming a second spacer pad layer in the second gap, the second spacer pad layer covering sidewalls of each of the second intermediate pattern structures and a bottom of the second gap; and
   removing the second spacer pad layer at the bottom of the second gap, and the fourth sacrificial dielectric layer; and
   removing the third sacrificial dielectric layer, to form second pattern structures.

5. The method of claim 4, wherein the step of forming the second spacer pad layer in the second gap, the second spacer pad layer covering sidewalls of each of the second intermediate pattern structures and a bottom of the second gap comprises:
   forming a second pad layer, wherein the second pad layer covers surfaces of each of the second intermediate pattern structures and the second gap;
   forming a second filling layer covering the second pad layer;
   etching back the second filling layer; and removing the second filling layer above the fourth sacrificial dielectric layer and the second pad layer above the fourth sacrificial dielectric layer, by using the fourth sacrificial dielectric layer as an etching stop layer; and
   removing the second filling layer between the second pad layer to form the second spacer pad layer.

6. The method of claim 5, wherein the second spacer pad layer has a third width, the second gap has a fourth width, and the fourth width is at least three times the third width.

7. The method of claim 4, wherein the transition layer comprises a first transition dielectric layer and a second transition dielectric layer, the first transition dielectric layer covers the first pattern structures, and the second transition dielectric layer is formed on the first transition dielectric layer.

8. The method of claim 7, wherein a material of the second transition dielectric layer is the same as a material of the support layer, the material of the second transition dielectric layer is the same as a material of the fourth sacrificial dielectric layer, and the third sacrificial dielectric layer and the fourth sacrificial dielectric layer have etching selectivity.

9. The method of claim 4, wherein the substrate further comprises a target layer formed under the support layer; and after the second pattern structures are formed, a pattern formed by a combination of the first pattern structures and the second pattern structures is transferred to the target layer, by using the first pattern structures and the second pattern structures as a mask.

10. The method of claim 4, wherein in a direction perpendicular to the substrate, the first pattern structures and the second pattern structures are arranged in a staggered manner.

11. The method of to claim 1, wherein the step of patterning the first sacrificial layer, and forming first intermediate pattern structures that are arranged at intervals along the first direction, the first gap being provided between the first intermediate pattern structures comprises:
   forming a mask layer on the second sacrificial dielectric layer;
   patterning the mask layer to form mask patterns, wherein the mask patterns comprise multiple openings arranged at intervals along the first direction, and the openings expose the second sacrificial dielectric layer; and
   etching the second sacrificial dielectric layer and the first sacrificial dielectric layer along the openings, to form the first intermediate pattern structures.

12. The method of claim 1, wherein a material of the first filling layer is the same as a material of the first sacrificial dielectric layer.

13. The method of claim 1, wherein the first spacer pad layer has a first width, the first gap has a second width, and the second width is at least three times the first width.

14. A semiconductor structure, wherein the semiconductor structure is manufactured by using the method of manufacturing a semiconductor structure according to claim 1.

* * * * *